(12) United States Patent
Ju et al.

(10) Patent No.: US 11,443,824 B2
(45) Date of Patent: Sep. 13, 2022

(54) MEMORY DEVICE INCLUDING TEST CONTROL CIRCUIT

(71) Applicant: SK hynix Inc., Icheon-si (KR)

(72) Inventors: Yucheon Ju, Suwon-si (KR); Hosung Cho, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 8 days.

(21) Appl. No.: 16/884,870

(22) Filed: May 27, 2020

(65) Prior Publication Data
US 2021/0174889 A1 Jun. 10, 2021

(30) Foreign Application Priority Data

Dec. 10, 2019 (KR) .................. 10-2019-0163684

(51) Int. Cl.
*G11C 29/00* (2006.01)
*G11C 29/38* (2006.01)
*G11C 29/36* (2006.01)

(52) U.S. Cl.
CPC .............. *G11C 29/38* (2013.01); *G11C 29/36* (2013.01); *G11C 2029/3602* (2013.01)

(58) Field of Classification Search
None
See application file for complete search history.

(56) References Cited

U.S. PATENT DOCUMENTS

| | | | | |
|---|---|---|---|---|
| 5,617,531 | A * | 4/1997 | Crouch .............. | G11C 29/006 714/10 |
| 6,353,905 | B1 * | 3/2002 | Noguchi ........ | G01R 31/318544 714/728 |
| 6,993,696 | B1 * | 1/2006 | Tanizaki ................ | G11C 29/16 714/731 |
| 2012/0182776 | A1 * | 7/2012 | Best .................... | G11C 11/4093 365/51 |
| 2013/0047049 | A1 * | 2/2013 | Chen .............. | G01R 31/318536 714/733 |

(Continued)

FOREIGN PATENT DOCUMENTS

| KR | 1020000037829 A | 7/2000 |
|---|---|---|
| KR | 1020020073082 A | 9/2002 |
| KR | 100894504 B1 | 4/2009 |

OTHER PUBLICATIONS

M. Agrawal, K. Chakrabarty and B. Eklow, "A Distributed, Reconfigurable, and Reusable BIST Infrastructure for Test and Diagnosis of 3-D-Stacked ICs," in IEEE Transactions on Computer-Aided Design of Integrated Circuits and Systems, vol. 35, No. 2, pp. 309-322, Feb. 2016, (Year: 2016).*

(Continued)

*Primary Examiner* — Daniel F. McMahon
(74) *Attorney, Agent, or Firm* — William Park & Associates Ltd.

(57) ABSTRACT

A memory device includes a memory cell array, an input/output circuit, a test register circuit, and a test control block. The memory cell array is suitable for storing data. The input/output circuit is suitable for inputting and outputting the data stored in the memory cell array. The test register circuit is suitable for testing the input/output circuit. The test control block includes a replica circuit having a replica configuration of the test register circuit by modeling the test register circuit, and is suitable for generating the data to test the test register circuit.

18 Claims, 4 Drawing Sheets

(56) References Cited

U.S. PATENT DOCUMENTS

2015/0187440 A1* 7/2015 Hollis ................. G11C 29/36
                                                          714/719
2017/0294236 A1* 10/2017 Kang ................ G11C 11/4096
2018/0374555 A1* 12/2018 Kwon ................ G11C 29/38
2021/0110880 A1* 4/2021 Park ................. G11C 29/38

OTHER PUBLICATIONS

A. Q. Olozabal, M. De Los Angeles Cifredo Chacon and D. G. Vela, "FPGA-Based Boundary-Scan Bist," 2006 International Conference on Field Programmable Logic and Applications, 2006, pp. 1-4, doi: 10.1109/FPL.2006.311281. (Year: 2006).*

* cited by examiner

MEMORY DEVICE INCLUDING TEST CONTROL CIRCUIT

CROSS-REFERENCE TO RELATED APPLICATION

This application claims priority under 35 U.S.C. § 119 to Korean Patent Application No. 10-2019-0163684 filed on Dec. 10, 2019, which is incorporated herein by reference in its entirety.

BACKGROUND

1. Field

Embodiments relate to a memory device having a test control circuit, and more particularly, to a memory device capable of performing a self test operation using a test control circuit therein, and a memory system including the same.

2. Discussion of the Related Art

With the demand for high integration and high performance semiconductor memory devices, the technology for packaging a plurality of semiconductor memory chips has continuously developed. Therefore, semiconductor memory devices having a 3D structure instead of a 2D structure are fabricated. The 2D structure is a structure in which a plurality of semiconductor memory chips are horizontally arranged on a PCB (Printed Circuit Board) through wires or bumps, and the 3D structure is a structure in which a plurality of semiconductor memory chips are vertically stacked. Recently, more and more SIP (System-in-Package)-type semiconductor systems are used, which have a structure in which a semiconductor memory device and a memory controller such as a CPU or GPU are fabricated as one package.

The increase in integration density of semiconductor memory devices raises the possibility that defects will occur in the semiconductor memory devices. In order to prevent a reduction in yield by defects occurring in a semiconductor memory device, a test is performed to verify whether memory cells of the semiconductor memory device are properly operating. The test of the semiconductor memory device may be performed by an external test device or ATE (Automated Test Equipment). However, such a test may be difficult to perform, when the semiconductor memory device is at the package level or is used in the fields by users.

Therefore, a self test circuit may be built in a semiconductor memory device to test memory cells without external test equipment. That is, a BIST (Built-in Self Test) circuit may be included in a semiconductor memory device to verify defective memory cells by writing and reading various patterns to and from memory cells according to a preset algorithm. Furthermore, a technique for applying a BIST circuit to a semiconductor memory device to increase the test speed and memory yield is being developed.

SUMMARY

In an embodiment, a memory device may include: a memory cell array suitable for storing data; an input/output circuit suitable for inputting and outputting the data stored in the memory cell array; a test register circuit suitable for testing the input/output circuit; and a test control block comprising a replica circuit configured by modeling the test register circuit, and suitable for generating data to test the test register circuit.

In an embodiment, a memory device may include: a memory cell array suitable for storing data; an input/output circuit suitable for inputting and outputting the data stored in the memory cell array; a test register circuit suitable for testing the input/output circuit; a data generation circuit suitable for generating pattern data and random data during a test operation; and a selection circuit suitable for selectively outputting the pattern data and the random data to the test register circuit and the memory cell array during the test operation.

In an embodiment, a stacked memory device may include: a base die; and a core die stacked on the base die. The base die may include: an interface circuit suitable for transmitting and receiving signals to and from a controller; a test register circuit suitable for testing the interface circuit; and a test control block comprising a replica circuit configured by modeling the test register circuit, and suitable for generating pattern data and random data to selectively test the test register circuit and the core die during a test operation.

In accordance with an embodiment, a semiconductor memory device can verify defects of various register circuits as well as the memory cell array included therein, using a BIST circuit for a self test operation of the semiconductor memory device. Therefore, the semiconductor memory device can perform a test operation at high speed without external test equipment, while minimizing a burden for a circuit area in the semiconductor memory device integrated highly.

DETAILED DESCRIPTION

Figure 1:
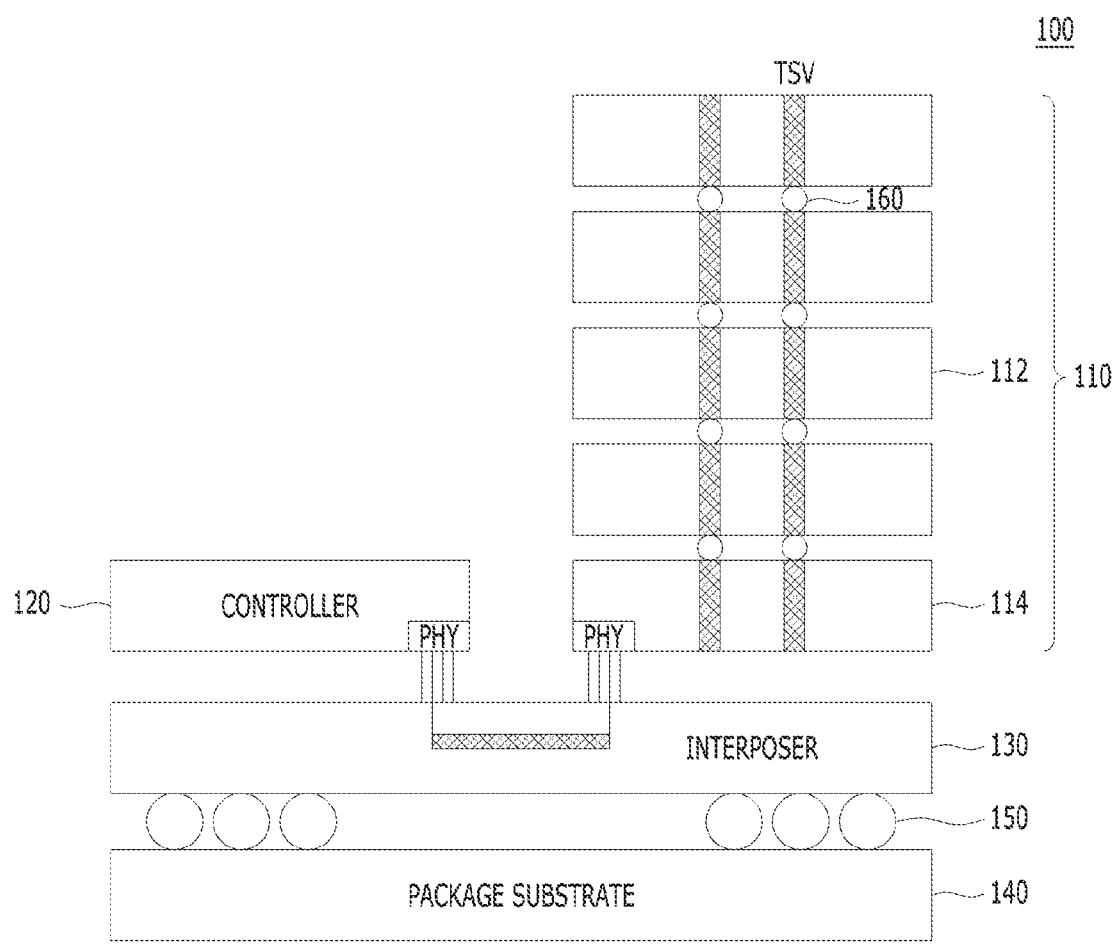
FIG. 1 is a diagram illustrating a semiconductor system in accordance with an embodiment.

Various embodiments are described below in detail with reference to the accompanying drawings. The present teachings may, however, be embodied in different forms and should not be construed as being limited to the embodiments set forth herein. Rather, these embodiments are provided so that this disclosure will be enabling, and will convey the scope of the present teachings to those skilled in the art. Throughout the disclosure, like reference numerals refer to like parts throughout the various figures and embodiments of the present teachings.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification may be represented in a singular form, embodiments are not so limited, and the corresponding components may also be represented in the plural form.

Various embodiments are directed to a memory device capable of selectively testing internal register circuits as well as a memory cell array, using a test control circuit for a self test operation, and a system including the same.

As illustrated in FIG. 1, a semiconductor system 100 in accordance with an embodiment may have an SIP (System-in-Package) structure. The semiconductor system 100 may include a memory device 110, a controller 120, an interposer 130, and a package substrate 140.

The memory device 110 may be a volatile memory device such as a DRAM (Dynamic Random Access Memory) or a nonvolatile memory device such as a FLASH memory, PCRAM (Phase Change RAM), ReRAM (Resistive RAM), FeRAM (Ferroelectric RAM), MRAM (Magnetic RAM), or STTRAM (Spin-Transfer Torque magnetic RAM). The memory device 110 may be configured as a combination of two or more of volatile memory devices and nonvolatile memory devices. In accordance with the present embodiment, the memory device 110 may be a stacked memory device including a plurality of chips. The memory device 110 is described below in more detail.

The controller 120 may include a CPU (Central Processing Unit), a GPU (Graphics Processing Unit), a DSP (Digital Signal Processor), an AP (Application Processor), a controller chip, a memory controller chip, and the like.

The memory device 110 and the controller 120 may be stacked on the interposer 130, or electrically coupled through micro bumps. The memory device 110 and the controller 120 may communicate with each other through a signal path formed in the interposer 130. That is, interfaces PHY of the memory device 110 and the controller 120 may be coupled through the interposer 130.

The interposer 130 may be stacked over the package substrate 140 and electrically coupled to the package substrate 140 through electrical coupling units 150 such as a bump ball or ball grid array. The interposer 130 and the package substrate 140 may have a signal path for transmitting a signal.

The memory device 110 may include a first integrated circuit chip 114 and a plurality of second integrated circuit chips 112 stacked over the first integrated circuit chip 114. The first integrated circuit chip 114 and the second integrated circuit chips 112 may be electrically coupled through micro bumps 160 and TSVs (Through Silicon Vias) formed vertically therethrough, and transmit/receive signals to/from each other.

The second integrated circuit chips 112, i.e. core dies 112, may have data storage spaces for storing data, such as a memory cell array and a memory register. On the other hand, the first integrated circuit chip 114, i.e. a base die 114, may include circuits for transmitting signals between the core dies 112 and the controller 120. When the memory device 110 is configured in such a manner, the number of input/output units may be significantly raised to effectively increase a bandwidth. Examples of the memory device 110 configured in such a manner may include an HBM (High Bandwidth Memory).

Figure 2:
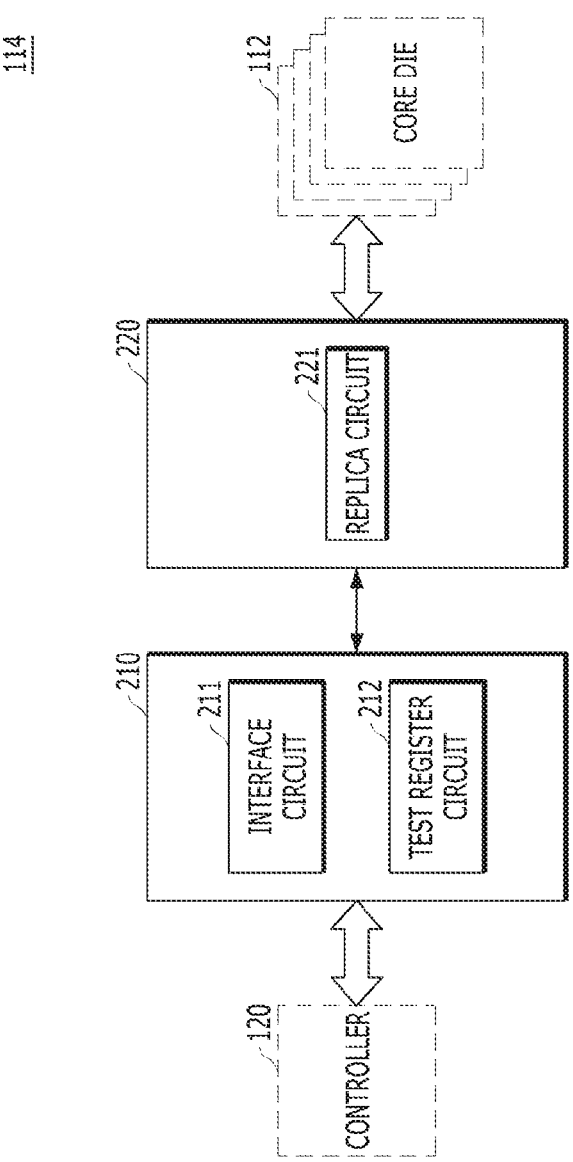
FIG. 2 is a diagram illustrating a base die of FIG. 1 in accordance with the present embodiment.

FIG. 2 is a diagram illustrating a configuration of the base die 114 of FIG. 1 in accordance with the present embodiment.

As described with reference to FIG. 1, the base die 114 may transmit signals between the controller 120 and the core die 112. The base die 114 and the controller 120 may communicate with each other through the signal path formed in the interposer 130. The interfaces of the base die 114 and the controller 120 may be coupled to each other through the interposer 130.

Referring to FIG. 2, the base die 114 may include an interface block 210 and a test control block 220. The interface block 210 may include an interface circuit 211 for transmitting/receiving signals between the controller 120 and core die 112. For example, as the interface circuit 211, the interface block 210 may include input/output circuits for inputting/outputting data stored in the memory cell arrays (not illustrated) included in the core dies 112.

The interface block 210 may further include a test register circuit 212 for testing the interface circuit 211. For example, the test register circuit 212 may include an LFSR (Linear Feedback Shift Register), an MISR (Multiple Input Signature Register), and the like. FIG. 2 illustrates that the test register circuit 212 is included in the interface block 210, but the test register circuit 212 may be provided outside the interface block 210 or included in the test control block 220.

The test control block 220 may include circuits for testing the memory device 110 without external test equipment. For example, the test control block 220 may include a BIST (Built-in Self Test) circuit which generates random data and tests the core die 112. The test control block 220 may generate random data, transmit the generated random data to the memory cell array of the core die 112, and test the memory cell array of the core die 112 by comparing data fed back from the core die 112 to the generated random data.

In accordance with the present embodiment, the test control block 220 may generate random data and pattern data during a test operation, and selectively test the core die 112 and the test register circuit 212. For this operation, the test control block 220 may further include a replica circuit 221 configured by modeling the test register circuit 212. That is, the replica circuit 221 may include an LFSR, an MISR, or the like.

The base die 114 may be directly and/or independently accessed by an external device such as test equipment through a test port such as a DAB (Direct Access Ball), regardless of the controller 120. The test register circuit 212 including an LFSR and an MISR may also be tested through the test port.

However, in order to test the test register circuit 212 using the test port, an operation result of the test register circuit 212 is received from the outside and calculated. In this case, it may take a long time to perform the test. When the memory device 110 is configured as an SIP, it is difficult to directly perform a test through the test port.

In accordance with the present embodiment, the test control block 220 may test the test register circuit 212 as well as the core die 112 in the memory device 110, using the replica circuit 221 configured by modeling the test register circuit 212. At this time, the test control block 220 may generate pattern data, transmit the generated pattern data to the test register circuit 212 and the replica circuit 221, and test the test register circuit 212 by comparing data fed back from the test register circuit 212 and the replica circuit 221.

Figure 3:
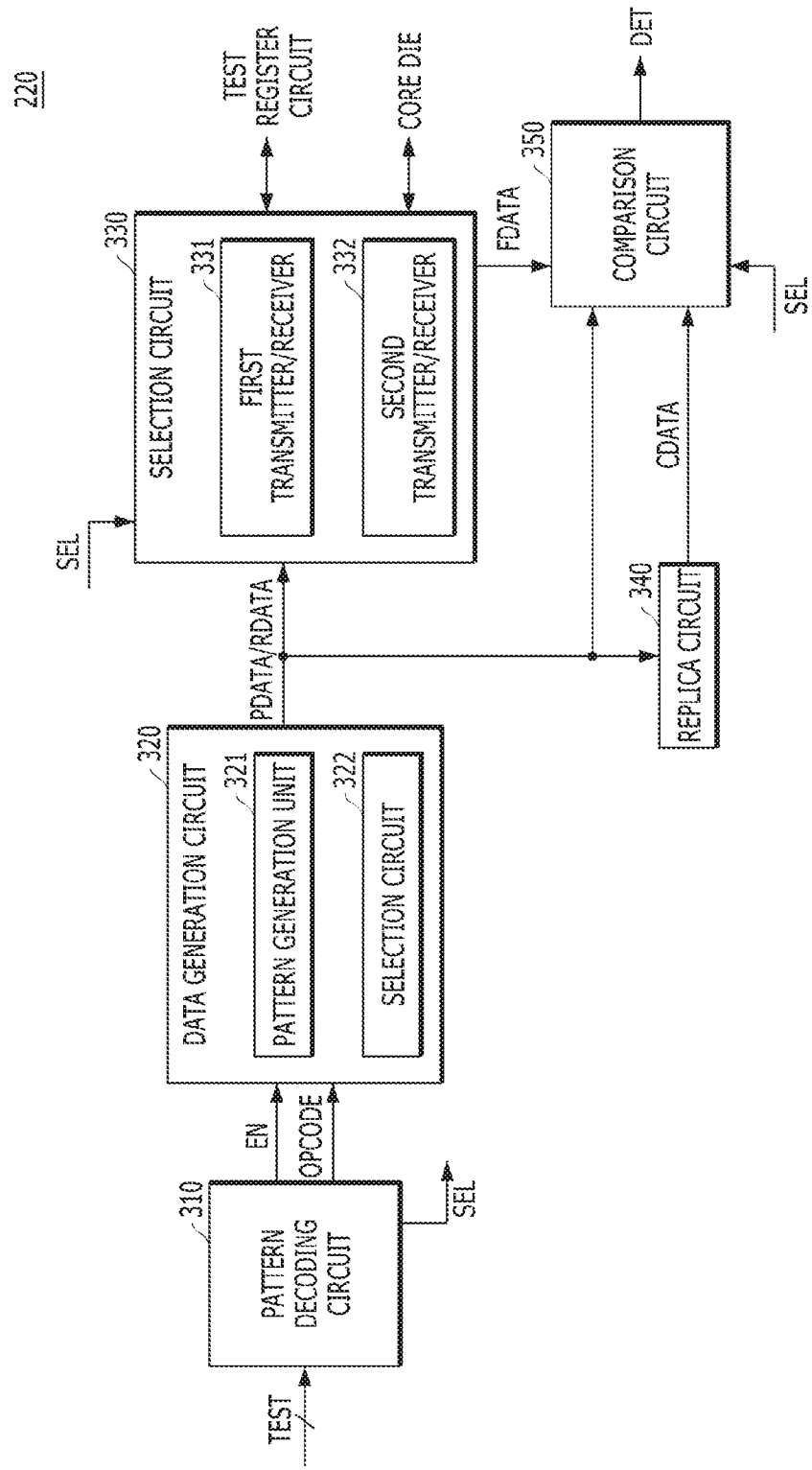
FIG. 3 is a diagram illustrating a test control block of FIG. 2 in accordance with the present embodiment.

FIG. 3 is a diagram illustrating the test control block 220 of FIG. 2 in accordance with the present embodiment. Referring to FIG. 3, the test control block 220 may include a pattern decoding circuit 310, a data generation circuit 320, a selection circuit 330, a replica circuit 340, and a comparison circuit 350.

During a test operation of the memory device 110, a test signal TEST may be generated according to an algorithm set in the test control block 220. The pattern decoding circuit 310 may generate a series of command sets to be performed according to the test signal TEST. The pattern decoding circuit 310 may include a plurality of registers, and the plurality of registers may store the corresponding command sets. The pattern decoding circuit 310 may count the test signal TEST, and output the command set of a register corresponding to the count value, among the plurality of registers.

In accordance with an embodiment, the command set generated by the pattern decoding circuit 310 may include a select signal SEL, an enable signal EN, and a code value OPCODE. When the test control block 220 tests the test register circuit 212, the pattern decoding circuit 310 may activate the select signal SEL. On the other hand, when the test control block 220 tests the memory cell array of the core die 112, the pattern decoding circuit 310 may deactivate the select signal SEL. When the test control block 220 generates pattern data PDATA, the pattern decoding circuit 310 may activate the enable signal EN. On the other hand, when the test control block 220 generates random data RDATA, the pattern decoding circuit 310 may deactivate the enable signal EN.

During a test operation of the memory device 110, the data generation circuit 320 may generate the pattern data PDATA and the random data RDATA based on the code value OPCODE, in response to the enable signal EN. The data generation circuit 320 may include a pattern generation unit 321 and an LFSR 322. When the enable signal EN is activated, the pattern generation unit 321 may generate the pattern data PDATA based on the code value OPCODE. On the other hand, when the enable signal EN is deactivated, the LFSR 322 may generate the random data RDATA based on the code value OPCODE. The operation of the pattern generation unit 321 in accordance with the present embodiment will be described in more detail with reference to FIG. 4.

During a test operation of the memory device 110, the selection circuit 330 may selectively output the pattern data PDATA and the random data RDATA to the test register circuit 212 and the memory cell array of the core die 112 in response to the select signal SEL. The selection circuit 330 may include a first transmitter/receiver 331 and a second transmitter/receiver 332.

When the select signal SEL is activated, the first transmitter/receiver 331 may be enabled to transmit the output data PDATA/RDATA of the data generation circuit 320 to the test register circuit 212. After transmitting the output data PDATA/RDATA of the data generation circuit 320, the enabled first transmitter/receiver 331 may receive the data of the test register circuit 212 as feedback data FDATA. At this time, the output data PDATA/RDATA of the data generation circuit 320 may include the pattern data PDATA.

When the select signal SEL is deactivated, the second transmitter/receiver 332 may be enabled to transmit the output data PDATA/RDATA of the data generation circuit 320 to the memory cell array of the core die 112. After transmitting the output data PDATA/RDATA of the data generation circuit 320, the enabled second transmitter/receiver 332 may receive the data of the memory cell array as the feedback data FDATA. At this time, the output data PDATA/RDATA of the data generation circuit 320 may include the pattern data PDATA or the random data RDATA.

The replica circuit 340 may correspond to the replica circuit 221 of FIG. 2. That is, the replica circuit 340 configured by modeling the test register circuit 212 of FIG. 2 may include an LFSR, MISR and the like. The replica circuit 340 may perform an operation based on the output data PDATA/RDATA of the data generation circuit 320, and output the operation result as operation data CDATA.

The comparison circuit 350 may select one of the output data PDATA/RDATA and the operation data CDATA of the data generation circuit 320 in response to the select signal SEL. The comparison circuit 350 may compare data, selected between the operation data CDATA and the output data PDATA/RDATA of the data generation circuit 320, to the feedback data FDATA, and output a detection result DET. For example, when the select signal SEL is activated, the comparison circuit 350 may select the operation data CDATA, compare the operation data CDATA to the feedback data FDATA, and output the comparison result DET. On the other hand, when the select signal SEL is deactivated, the comparison circuit 350 may select the output data PDATA/RDATA of the data generation circuit 320, compare the selected data to the feedback data FDATA, and output the comparison result DET.

Figure 4:
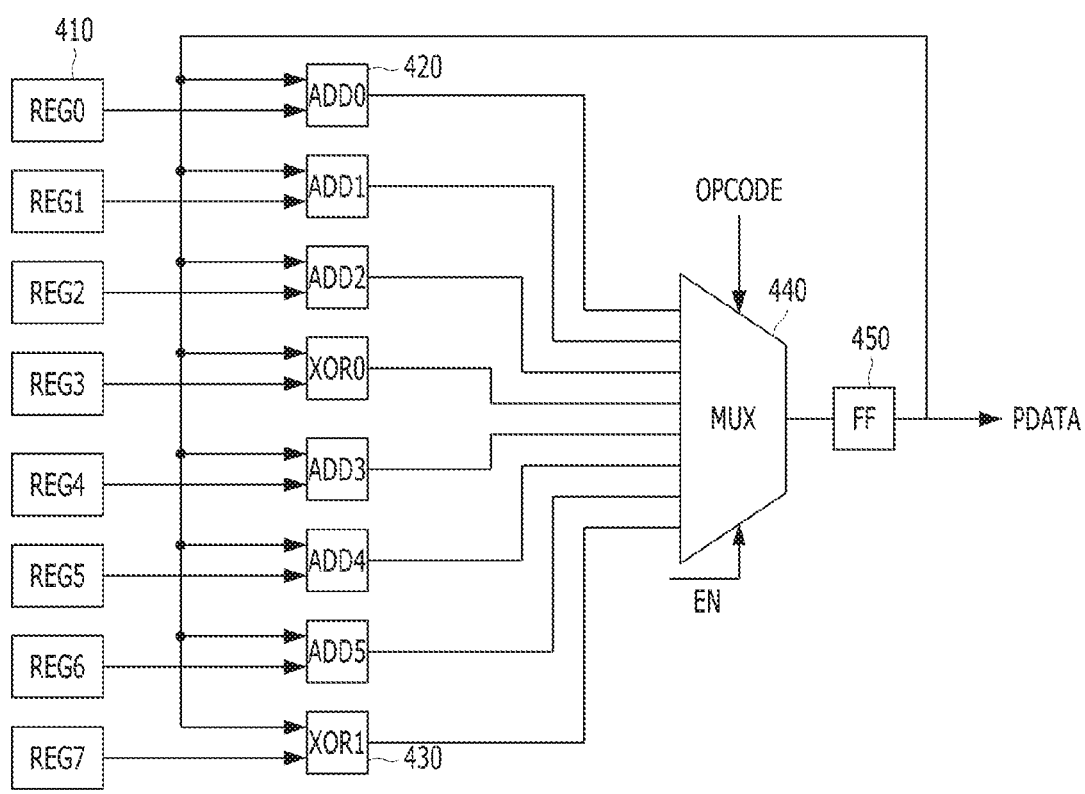
FIG. 4 is a diagram illustrating a pattern generation unit of FIG. 3 in accordance with the present embodiment.

FIG. 4 is a diagram illustrating a configuration of the pattern generation unit 321 of FIG. 3 in accordance with the present embodiment.

The pattern generation unit 321 may include registers (REG0 to REG7) 410, adders (ADD0 to ADD5) 420, XOR operation units (XOR0 and XOR1) 430, a multiplexer (MUX) 440, and a flip-flop (FF) 450. FIG. 4 illustrates that the pattern generation unit 321 includes eight registers 410, but the present embodiment is not limited thereto. In accordance with an embodiment, the numbers of the adders 420 and the XOR operation units 430 may be changed, or the pattern generation unit 321 may include different types of operation units.

The pattern generation unit 321 may select some of the plurality of registers 410 according to the set code value OPCODE, and generate the pattern data PDATA based on values stored in the selected registers. For this operation, the adders 420 and the XOR operation units 430 may perform corresponding operations on the feedback pattern data PDATA and the values stored in the plurality of registers 410. The multiplexer 440 may be enabled in response to the enable signal EN, select one of outputs of the adders 420 and the XOR operation units 430 based on the code value OPCODE, and output the selected signal as the pattern data PDATA. Therefore, the pattern data PDATA may be generated as a pattern which is determined according to the code value OPCODE.

In accordance with the present embodiment, the test control circuit included in the memory device may selectively generate pattern data and random data according to the test operation. The test control circuit may include the replica circuit configured by modeling the register circuit included in the memory device, transmit the generated pattern data to the register circuit and the replica circuit, and verify a defect of the register circuit based on a difference between data fed back from the register circuit and the replica circuit. Furthermore, the test control circuit may transmit the generated pattern data and random data to the memory cell array of the memory device, and verify a defect of the memory cell array based on a difference between the generated pattern data and random data and data fed back from the memory cell array. Therefore, the test control circuit can verify defects of various registers circuits as well as the memory cell array included in the memory device.

Although various embodiments have been described for illustrative purposes, it will be apparent to those skilled in the art that various changes and modifications may be made without departing from the spirit and scope of the present teachings as defined in the following claims.

What is claimed is:

1. A memory device comprising:
   a memory cell array suitable for storing data;
   an input/output circuit suitable for inputting and outputting the data stored in the memory cell array;
   a test register circuit suitable for testing the input/output circuit; and
   a test control block comprising a replica circuit having a replica configuration of the test register circuit by modeling the test register circuit, and suitable for generating the data to test the test register circuit,
   wherein the test control block is suitable for testing the test register circuit by generating pattern data, transmitting the generated pattern data to the test register circuit and the replica circuit, and comparing the data which are fed back from the test register circuit to the data which are fed back from the replica circuit.

2. The memory device of claim 1, wherein the test control block is suitable for testing the memory cell array by generating pattern data and random data, transmitting the generated pattern data and random data to the memory cell array, and comparing the data fed back from the memory cell array to the generated pattern data and random data.

3. The memory device of claim 1, wherein the test control block comprises a BIST (Built-In Self Test) circuit.

4. The memory device of claim 1, wherein the test register circuit and the replica circuit comprise an LFSR (Linear Feedback Shift Register) and an MISR (Multiple Input Signature Register).

5. A memory device comprising:
   a memory cell array suitable for storing data;
   an input/output circuit suitable for inputting and outputting the data stored in the memory cell array;
   a test register circuit suitable for testing the input/output circuit;
   a data generation circuit suitable for generating pattern data and random data during a test operation;
   a selection circuit suitable for selectively outputting the pattern data and the random data to the test register circuit and the memory cell array during the test operation; and
   a replica circuit having a replica configuration of the test register circuit by modeling the test register circuit, and suitable for generating operation data based on output data of the data generation circuit,
   wherein the replica circuit is capable of testing the test register circuit based on a comparison of data outputted from the test register circuit with data outputted from the replica circuit.

6. The memory device of claim 5, further comprising:
   a pattern decoding circuit suitable for generating a select signal, an enable signal, and a code value according to the test operation,
   wherein the pattern decoding circuit is suitable for activating the select signal during the test operation of the test register circuit, and for deactivating the select signal during the test operation of the memory cell array.

7. The memory device of claim 6, wherein the data generation circuit comprises:
   a pattern generation unit suitable for generating the pattern data based on the code value when the enable signal is activated; and
   an LFSR (Linear Feedback Shift Register) suitable for generating the random data based on the code value, when the enable signal is deactivated.

8. The memory device of claim 7, wherein the pattern generation unit comprises:
   a plurality of registers;
   a plurality of operation units suitable for performing a corresponding operation on values stored in the plurality of registers and feedback data of the pattern data; and
   a multiplexer suitable for selecting one of the plurality of operation units based on the code value and outputting an output of the selected operation unit as the pattern data, in response to the enable signal.

9. The memory device of claim 6, wherein the selection circuit comprises:
   a first transmitter/receiver suitable for transmitting the output data of the data generation circuit to the test register circuit, and for receiving data of the test register circuit as feedback data, when the select signal is activated; and
   a second transmitter/receiver suitable for transmitting the output data of the data generation circuit to the memory cell array, and for receiving data of the memory cell array as the feedback data, when the select signal is deactivated.

10. The memory device of claim 9, further comprising:
    a comparison circuit suitable for selecting one of the operation data and the output data of the data generation circuit in response to the select signal, comparing the selected data to the feedback data, and outputting a detection result.

11. A stacked memory device comprising:
    a base die; and
    a core die stacked on the base die,
    wherein the base die comprises:
      an interface circuit suitable for transmitting and receiving signals to and from a controller;
      a test register circuit suitable for testing the interface circuit; and
      a test control block comprising a replica circuit having a replica configuration of the rest register circuit by modeling the test register circuit, and suitable for generating pattern data and random data to selectively test the test register circuit and the core die during a test operation.

12. The stacked memory device of claim 11, wherein the test control block is suitable for testing the test register circuit by transmitting the pattern data to the test register circuit and the replica circuit and comparing the data which are fed back from the test register circuit to the data which are fed back from the replica circuit.

13. The stacked memory device of claim 11, wherein the test control block is suitable for testing the core die by transmitting the pattern data and the random data to the core die and comparing the data which are fed back from the core die to the pattern data and the random data.

14. The stacked memory device of claim 11, wherein the test control block comprises:
    a pattern decoding circuit suitable for generating a select signal, an enable signal, and a code value according to the test operation;
    a data generation circuit suitable for generating the pattern data and the random data based on the code value, in response to the enable signal; and
    a selection circuit suitable for selectively outputting the pattern data and the random data to the test register circuit and the core die in response to the select signal.

15. The stacked memory device of claim 14, wherein the pattern decoding circuit is suitable for activating the select signal during a test operation of the test register circuit, and for deactivating the select signal during a test operation of the core die.

16. The stacked memory device of claim 15, wherein the data generation circuit comprises:
   a pattern generation unit suitable for generating the pattern data based on the code value when the enable signal is activated; and
   an LFSR (Linear Feedback Shift Register) suitable for generating the random data based on the code value, when the enable signal is deactivated.

17. The stacked memory device of claim 15, wherein the selection circuit comprises:
   a first transmitter/receiver suitable for transmitting output data of the data generation circuit to the test register circuit, and for receiving data of the test register circuit as feedback data, when the select signal is activated; and
   a second transmitter/receiver suitable for transmitting the output data of the data generation circuit to the core die, and for receiving data of the core die as the feedback data, when the select signal is deactivated.

18. The stacked memory device of claim 17, wherein the test control block further comprises a comparison circuit suitable for selecting one of the output data of the data generation circuit and output data of the replica circuit in response to the select signal, comparing the selected data to the feedback data, and outputting a detection result.

\* \* \* \* \*